United States Patent
Lee

(10) Patent No.: US 10,050,374 B1
(45) Date of Patent: Aug. 14, 2018

(54) DEVICE WITH WATERPROOF STRUCTURE

(71) Applicant: GETAC TECHNOLOGY CORPORATION, Hsinchu County (TW)

(72) Inventor: Kun-Cheng Lee, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 15/611,646

(22) Filed: Jun. 1, 2017

(51) Int. Cl.
H05K 5/02 (2006.01)
H01R 13/52 (2006.01)
H01R 13/447 (2006.01)

(52) U.S. Cl.
CPC ....... H01R 13/5202 (2013.01); H01R 13/447 (2013.01)

(58) Field of Classification Search
CPC .............. H01R 13/5202; H01R 13/501; H01R 13/506; H01R 13/5213; H01R 13/447; H05K 5/069; H05K 5/039
See application file for complete search history.

(56) References Cited

U.S. PATENT DOCUMENTS

| | | | | |
|---|---|---|---|---|
| 9,143,591 B2 * | 9/2015 | Liang | ...................... | H04M 1/18 |
| 9,795,044 B2 * | 10/2017 | Lai | ...................... | H05K 5/0086 |
| 9,843,659 B2 * | 12/2017 | Yamaguchi | ........... | H04M 1/035 |
| 2009/0109635 A1 * | 4/2009 | Chen | ..................... | G06F 1/1626 |
| | | | | 361/728 |
| 2009/0296323 A1 * | 12/2009 | Yang | ..................... | H01R 13/447 |
| | | | | 361/679.01 |
| 2010/0210125 A1 * | 8/2010 | Wu | ..................... | H01R 13/4534 |
| | | | | 439/136 |
| 2012/0067711 A1 * | 3/2012 | Yang | ...................... | H01H 13/86 |
| | | | | 200/341 |
| 2012/0118773 A1 * | 5/2012 | Rayner | ................. | G06F 1/1626 |
| | | | | 206/320 |
| 2012/0285097 A1 * | 11/2012 | Sakakura | ........... | H01R 13/5213 |
| | | | | 49/465 |
| 2013/0044420 A1 * | 2/2013 | Iwamoto | ............. | H01R 13/447 |
| | | | | 361/679.01 |
| 2014/0080334 A1 * | 3/2014 | Tetsuya | ............. | H01R 13/5213 |
| | | | | 439/136 |
| 2014/0113467 A1 * | 4/2014 | Senatori | ............... | G06F 1/1633 |
| | | | | 439/142 |
| 2015/0022955 A1 * | 1/2015 | Yamaguchi | .......... | H05K 5/0239 |
| | | | | 361/679.01 |
| 2016/0027465 A1 * | 1/2016 | Lee | ........................ | G11B 17/04 |
| | | | | 720/613 |
| 2018/0042132 A1 * | 2/2018 | Hashii | .................... | H05K 5/069 |

* cited by examiner

Primary Examiner — Hoa C Nguyen
Assistant Examiner — Christopher L Augustin

(57) ABSTRACT

A device with waterproof structure includes a case, a waterproof cover, and a fixed element. The case has an opening and a waterproof wall surrounding the opening. The waterproof cover is screwed to the case and is selectively covered or moved away from the opening. The fixed element includes a fixed portion and a waterproof plate. The waterproof plate covers the outer edge and one side surface of the fixed portion. The fixed element is detachably disposed to the waterproof cover through the fixed portion. When the waterproof cover covers on the opening, the outer edge of the waterproof plate is close contacted to the waterproof wall. Therefore, using the waterproof plate which could close contact to the waterproof wall to replace the O-ring also could achieve the purpose of waterproofing.

18 Claims, 8 Drawing Sheets

DEVICE WITH WATERPROOF STRUCTURE

BACKGROUND OF THE INVENTION

Field of the Invention

The present invention relates to devices with waterproof structures and, more particularly, to a device with a waterproof structure such as a door.

Description of the Prior Art

A door is usually disposed at a port of a connector for an electronic device with strict waterproofing requirement and adapted to close and protect the port of the connector. To meet the waterproofing requirement, a rubber O-ring is fitted around the door so that the door is fitted at an opening of a casing of the connector, effectuating waterproofing.

The aforesaid assembly process requires stretching the waterproof O-ring and then fitting it around the door. However, if the assembly process is performed imprecisely, the O-ring may not be uniform in diameter, deteriorating reliability of waterproofing performance. Furthermore, waterproof failure will happen, if the waterproof O-ring loosens because of an abrupt, large variation in temperature or long use.

SUMMARY OF THE INVENTION

In view of the aforesaid drawbacks of the prior art, it is an objective of the present invention to provide, in an embodiment thereof, a device with a waterproof structure which comprises a casing, a lid and a securing element. The casing is penetrated by an opening. The opening is surrounded by a waterproof wall. The lid is fastened to the casing to selectively cover or move away from the opening. The securing element comprises a snap engaging portion and a waterproof plate. The waterproof plate encloses the snap engaging portion and covers a lateral surface thereof. Due to the snap engaging portion, the securing element is demountably mounted on the lid, and a rim of the waterproof plate is in tight contact with the waterproof wall after the lid has covered the opening.

An O-ring is replaced with the waterproof plate which is in tight contact with the waterproof wall at the opening on the casing, effectuating waterproofing. Due to the snap engaging portion, the waterproof plate is demountably mounted on the lid to not only preclude errors which might otherwise arise from an assembly process but also allow the securing element to be quickly replaceable in response to wear and tear arising from long use of the waterproof plate.

In an embodiment, the snap engaging portion and the waterproof plate are integrally formed by double injection. The waterproof plate is made of a resilient material in order to be tightly engaged with the waterproof wall. The snap engaging portion is made of a rigid material in order to be steadily fastened to the lid. Hence, the snap engaging portion and the waterproof plate are manufactured from different materials and then adhered together before undergoing a mounting process. Considering the importance of ease of assembly and reliability of use, the snap engaging portion and the waterproof plate are integrally formed by double injection to not only simplify the manufacturing process but also enhance durability.

In an embodiment, the lid comprises at least two fastening holes, whereas the snap engaging portion comprises at least two engaging hooks. The engaging hooks penetrate the fastening holes, respectively. The securing element can be quickly engaged with the lid through the engaging hooks of the snap engaging portion and demounted easily with force by a user. Therefore, the assembly process is easy and speedy.

In an embodiment, the engaging hooks each comprise a hook portion and a shank. The fastening holes of the lid are slightly larger than the shanks of the engaging hooks. After the engaging hooks have penetrated the fastening holes, the hook portions are snap-engaged with the other sides of the fastening holes, respectively, whereas the shanks are disposed in the fastening holes, respectively. If the fastening holes are slightly larger than the shanks of the engaging hooks, there will be sufficient room for the sliding of the shanks in the fastening holes. At this point in time, when the waterproof plate disposed on the engaging hooks is to be fastened to the waterproof wall, the aforesaid room for the sliding of the engaging hooks in the fastening holes enables the waterproof plate to slide radially, slightly and thus adjustably reach the best position conducive to tight contact with the waterproof wall.

In an embodiment, the device with a waterproof structure further comprises a door slidably disposed on the lid to cover the lid. This not only makes the waterproof structure look attractive, but also boosts the protection provided to the lid and thereby protects the lid against any hit to the detriment of its waterproofing performance. The waterproof wall extends to form two fastening walls. Two inner hooks are disposed at one end of the door. The inner hooks hook onto the fastening walls, respectively, so that the door becomes fastened to the waterproof wall to cover the lid.

In an embodiment, the door comprises a bulge and two through holes. The lid comprises a positioning recess and two positioning elements. Hence, the bulge of the door is received in the positioning recess of the lid, whereas the positioning elements are penetratingly disposed in the through holes, respectively, allowing the door to be connected to the lid. Moreover, the door will be unlikely to fall off and get lost, even if the user opens the lid to access a connector.

The door is connected to the lid not only by the aforesaid technique but also by the others. For instance, in an embodiment, the door is disposed on the lid in a manner to face away from the securing element, whereas the snap engaging portion of the securing element comprises a plurality of engaging hooks. The engaging hooks penetrate the lid and are snap-engaged with the door. Furthermore, the door comprises a bulge, whereas the lid comprises a positioning recess. The bulge is received in the positioning recess so that the door is positioned at a location as needed. Moreover, the waterproof wall extends to form two fastening walls. The fastening walls each have at least one through recess. The door has at least two inner hooks. The inner hooks penetrate the through recesses and slide along the fastening walls. Therefore, the door is disposed at the waterproof wall to cover the lid more tightly.

DETAILED DESCRIPTION OF THE EMBODIMENTS

Figure 1:
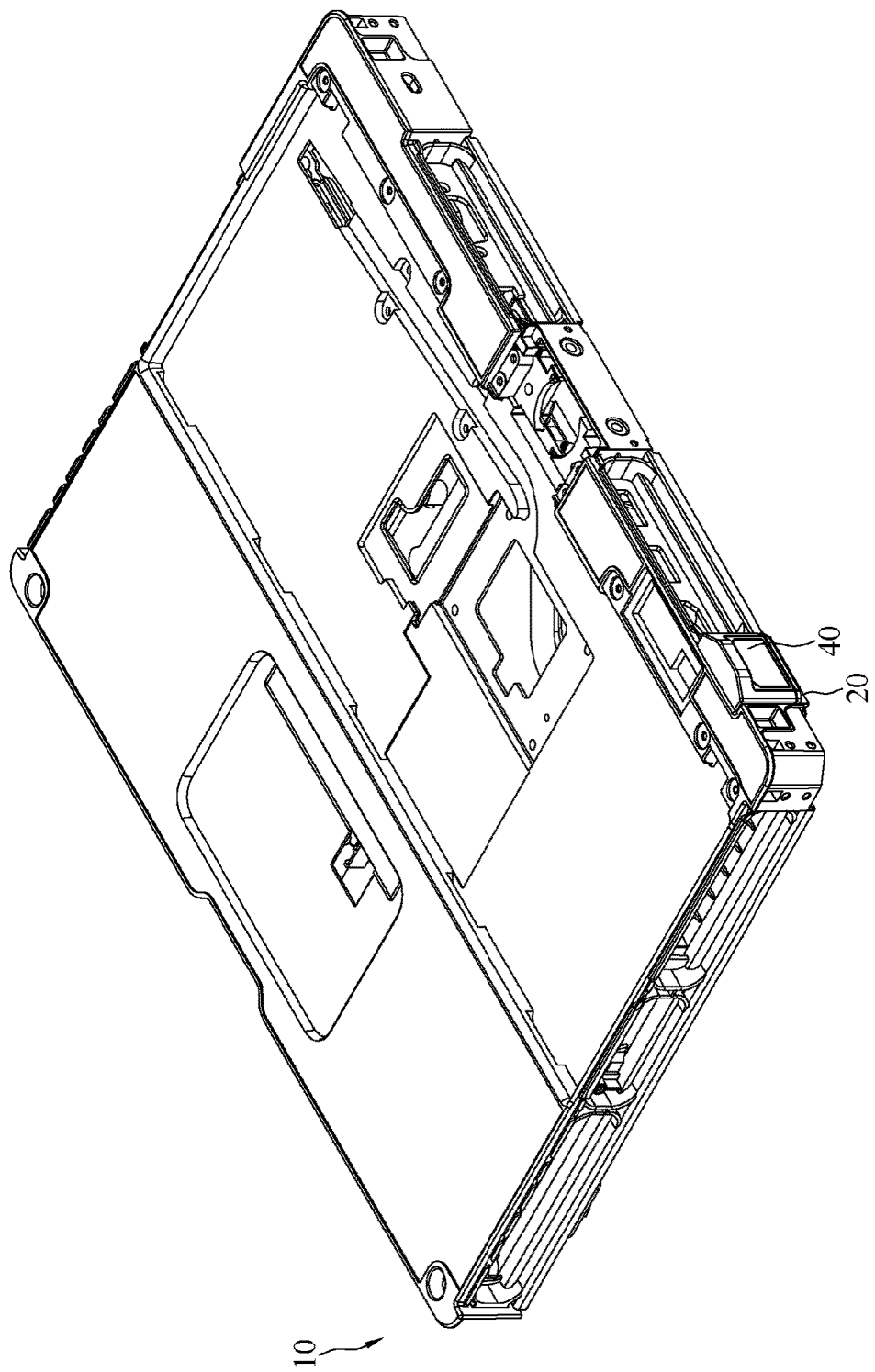
FIG. 1 is a schematic view of a device with a waterproof structure that shuts a lid according to a first embodiment of the present invention.
Figure 2:
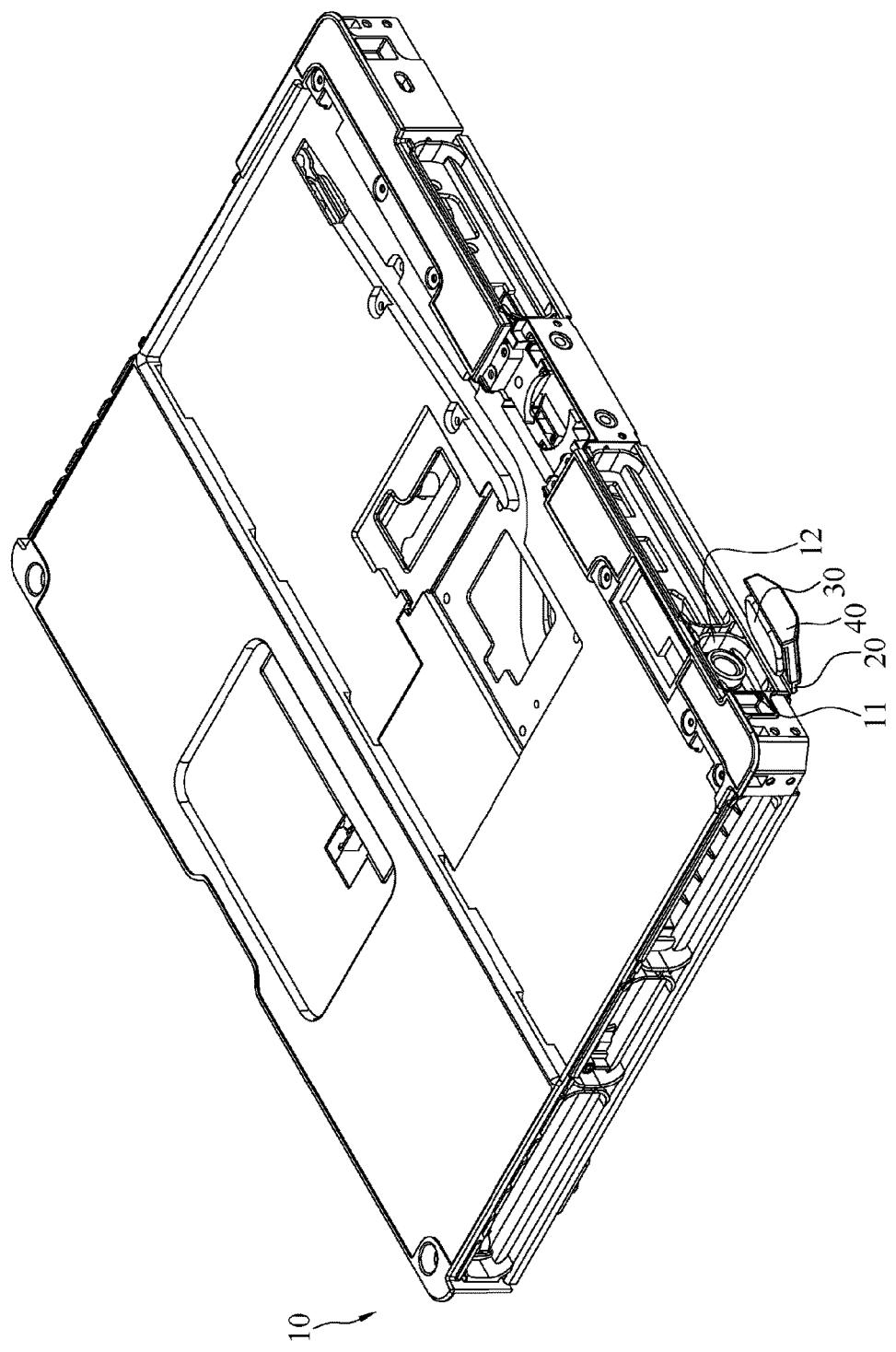
FIG. 2 is a schematic view of the device with a waterproof structure that opens the lid according to the first embodiment of the present invention.
Figure 3:
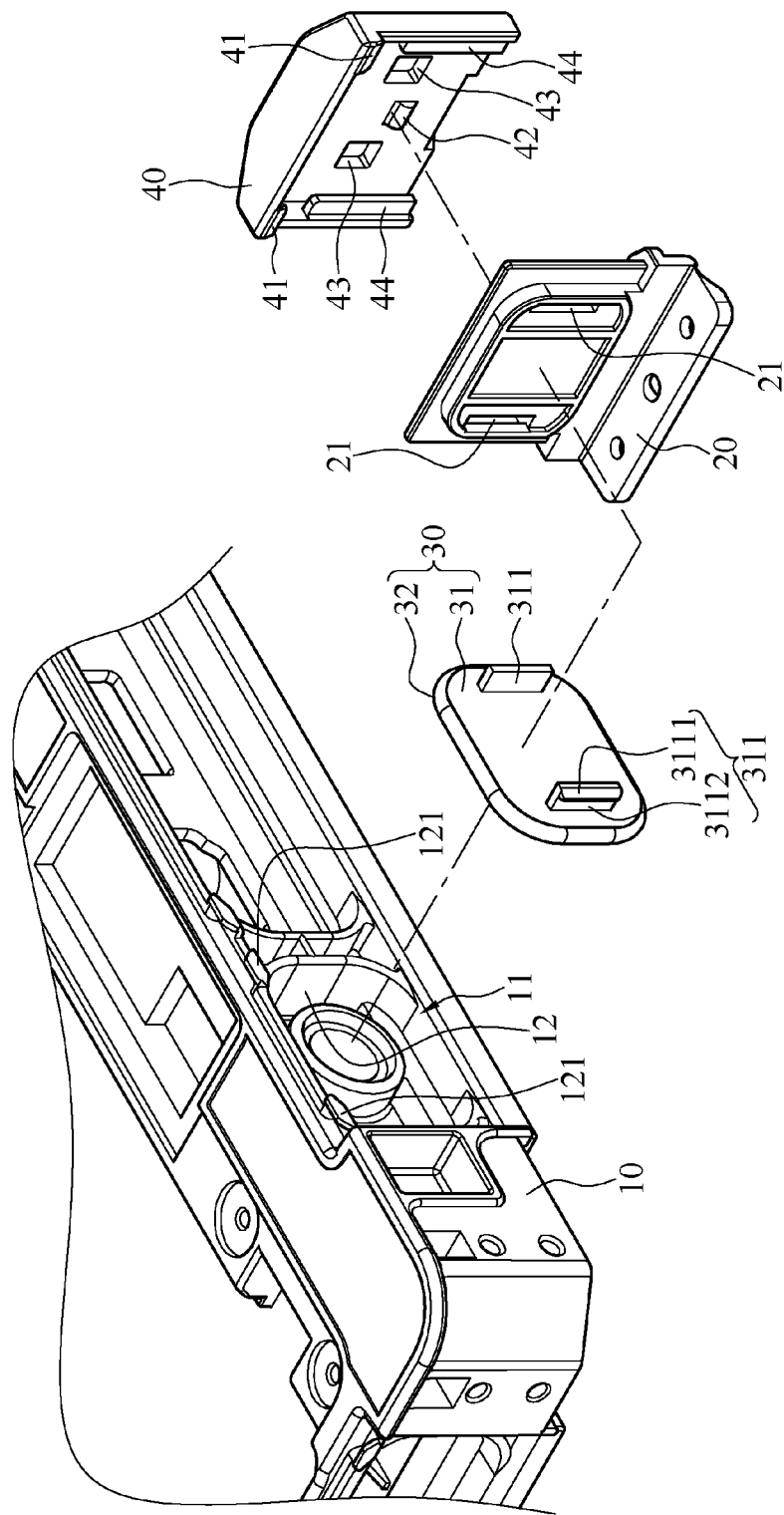
FIG. 3 is an exploded view of the waterproof structure according to the first embodiment of the present invention.
Figure 4:
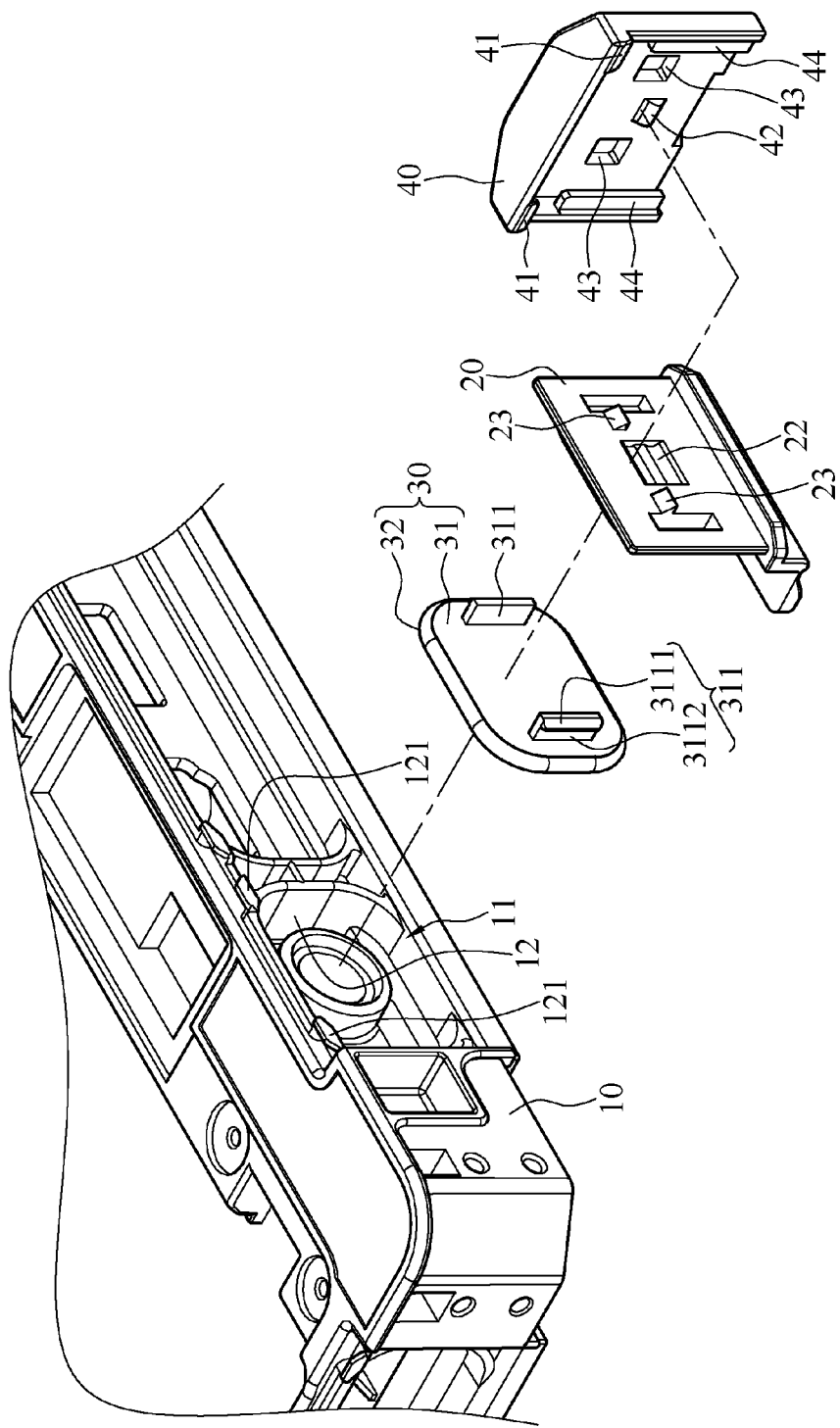
FIG. 4 is an exploded view of the waterproof structure viewed from another angle according to the first embodiment of the present invention.

FIG. 1 is a schematic view of a device with a waterproof structure that shuts a lid according to a first embodiment of the present invention. FIG. 2 is a schematic view of the device with a waterproof structure that opens the lid according to the first embodiment of the present invention. FIG. 3 is an exploded view of the waterproof structure according to the first embodiment of the present invention. FIG. 4 is an exploded view of the waterproof structure viewed from another angle according to the first embodiment of the present invention. In the first embodiment, the device is any electronic device to be waterproofed, such as notebook computer, cellular phone, and tablet, but the present invention is not limited thereto. FIG. 3 and FIG. 4 are focused on the waterproof structure, thereby showing just part of a casing 10 of the device. In this embodiment, the device with a waterproof structure comprises the casing 10, a lid 20, a securing element 30 and a door 40.

Referring to FIG. 3 and FIG. 4, the casing 10 is penetrated by an opening 11, and the opening 11 is surrounded by a waterproof wall 12. The opening 11 holds a port of a connector or enables another component to be mounted in place.

The lid 20 is fastened to the casing 10 to selectively cover or move away from the opening 11. FIG. 1 shows that the lid 20 covers the opening 11. FIG. 2 shows that the lid 20 moves away from the opening 11, that is, opens. The securing element 30 and the door 40 are disposed on the lid 20 and move together with the lid 20. Alternatively, the lid 20 is fixed to the casing 10 by adhesion, a means of securing, and the like, but the present invention is not limited thereto.

Referring to FIG. 3 and FIG. 4, the securing element 30 comprises a snap engaging portion 31 and a waterproof plate 32. The waterproof plate 32 encloses the snap engaging portion 31 and covers a lateral surface thereof. Referring to FIG. 3, the waterproof plate 32 covers a surface of the snap engaging portion 31, wherein the covered surface faces the opening 11. The waterproof plate 32 encloses the snap engaging portion 31 and slightly extends to an opposing surface of the snap engaging portion 31. A manufacturing process of the securing element 30 involves manufacturing the snap engaging portion 31 and the waterproof plate 32 separately and then adhering them together. Alternatively, in the first embodiment, the snap engaging portion 31 and the waterproof plate 32 are integrally formed by double injection. The waterproof plate 32 is made of a resilient material, whereas the snap engaging portion 31 is made of a rigid material.

Due to the snap engaging portion 31, the securing element 30 is demountably mounted on the lid 20. In the first embodiment, the lid 20 comprises two fastening holes 21, whereas the snap engaging portion 31 comprises two engaging hooks 311. The engaging hooks 311 penetrate the fastening holes 21, respectively, so that the securing element 30 can be mounted on the lid 20. When the lid 20 covers the opening 11, the securing element 30 mounted on the lid 20 moves together with the lid 20 so that the waterproof plate 32 covers the opening 11. After the waterproof plate 32 has covered the opening 11, the rim of the waterproof plate 32 is in tight contact with the waterproof wall 12, providing a waterproofing effect.

In the first embodiment, the engaging hooks 311 each comprise a hook portion 3111 and a shank 3112. The fastening holes 21 are slightly larger than the shanks 3112 of the engaging hooks 311. After the engaging hooks 311 of the snap engaging portion 31 have penetrated the fastening holes 21, the hook portions 3111 hook onto the lid 20, whereas the shanks 3112 are penetratingly disposed in the fastening holes 21. With the fastening holes 21 being slightly larger than the shanks 3112, the shanks 3112 can move radially inside the fastening holes 21 slightly. Hence, after the securing element 30 has been mounted on the lid 20, the securing element 30 can move relative to the lid 20 slightly. With the securing element 30 being capable of moving relative to the lid 20 slightly, the waterproof plate 32 of the securing element 30 covers the opening 11 and comes into tight 360°-rotatable contact with the waterproof wall 12, allowing the waterproof plate 32 to align with the waterproof wall 12 accurately, not to mention that the rim of the waterproof plate 32 can be in tightest contact with the waterproof wall 12. Hence, no process of mounting the lid 20 in place or mounting the securing element 30 on the lid 20 leads to a tolerance which might otherwise affect the degree of tight contact between the waterproof plate 32 and the waterproof wall 12.

The door 40 covers the lid 20 from the outside and is fastened to the casing 10 to prevent the lid 20 in operation from falling off when hit. In the first embodiment, the door 40 is slidably disposed on the lid 20 and fastened to the casing 10. Referring to FIG. 3 and FIG. 4, the waterproof wall 12 extends to form two fastening walls 121, and two inner hooks 41 are disposed at two ends of the door 40, respectively. When the lid 20 covers the opening 11, a user may slide the door 40 downward so that the inner hooks 41 hook onto the fastening walls 121, respectively, fastening the door 40 to the casing 10; hence, the lid 20 never opens just because it is hit, and the appearance of the device provides a sense of completeness to the user. Fastening the door 40 to the casing 10 in the aforesaid manner not only prevents the lid 20 from opening just because it is hit, but also allows the lid 20 to open quickly—the user slides the door 40 upward to unfasten it, thereby opening the lid 20.

To enable the door 40 to not only move together with the lid 20 without separating from the lid 20 but also slide relative to the lid 20, it is necessary for the door 40 to comprise a bulge 42, two through holes 43 and two blocking plates 44, and for the lid 20 to comprise a positioning recess 22 and two positioning elements 23. The bulge 42 is received in the positioning recess 22. The positioning elements 23 are penetratingly disposed in the through holes 43, respectively. The blocking plates 44 cover a surface of the lid 20, wherein the covered surface faces away from the positioning recess 22 and the positioning elements 23. Grooves are formed on inner surfaces of the door 40 and the blocking plates 44 to not only enable the lid 20 to slide along the grooves, but also allow the door 40 to slide relative to the lid 20. The interaction of the positioning recess 22, the two positioning elements 23, the bulge 42 and the two through holes 43 ensures that the door 40 can slide for a specific distance only but is unlikely to separate from the lid 20.

The bulge 42 slides within two recess portions of the positioning recess 22, providing a sense of snap-engagement to the user; the door 40 is moved upward and thus opened. At this point in time, the bulge 42 moves from the recess portion below the positioning recess 22 to the recess portion above the positioning recess 22, and falls into the recess portion again as soon as it passes an elevation in the midst of the course of its movement, providing a sense of snap-engagement to the user. Once the bulge 42 is received in the upper recess portion, it will no longer move upward; hence, at this point in time, the bulge 42 is fixed in place. Furthermore, the bottoms of the through holes 43 of the door 40 are snap-engaged with the bottoms of the positioning elements 23, preventing the door 40 from moving upward and separating from the lid 20.

To cover the opening 11 and effectuate waterproofing, the user only needs to cover the opening 11 with the lid 20 so that the waterproof plate 32 of the securing element 30 comes into tight contact with the waterproof wall 12. Afterward, the user slides the door 40 downward to fasten it to the casing 10, preventing the lid 20 from being hit and thus opened. An O-ring is replaced with the waterproof plate 32 which is in tight contact with the waterproof wall 12 at the opening 11 on the casing 10, effectuating waterproofing. Due to the snap engaging portion 31, the waterproof plate 32 is demountably mounted on the lid 20 to not only preclude errors which might otherwise arise from an assembly process but also allow the securing element to be quickly replaceable in response to wear and tear arising from long use of the waterproof plate.

Figure 5:
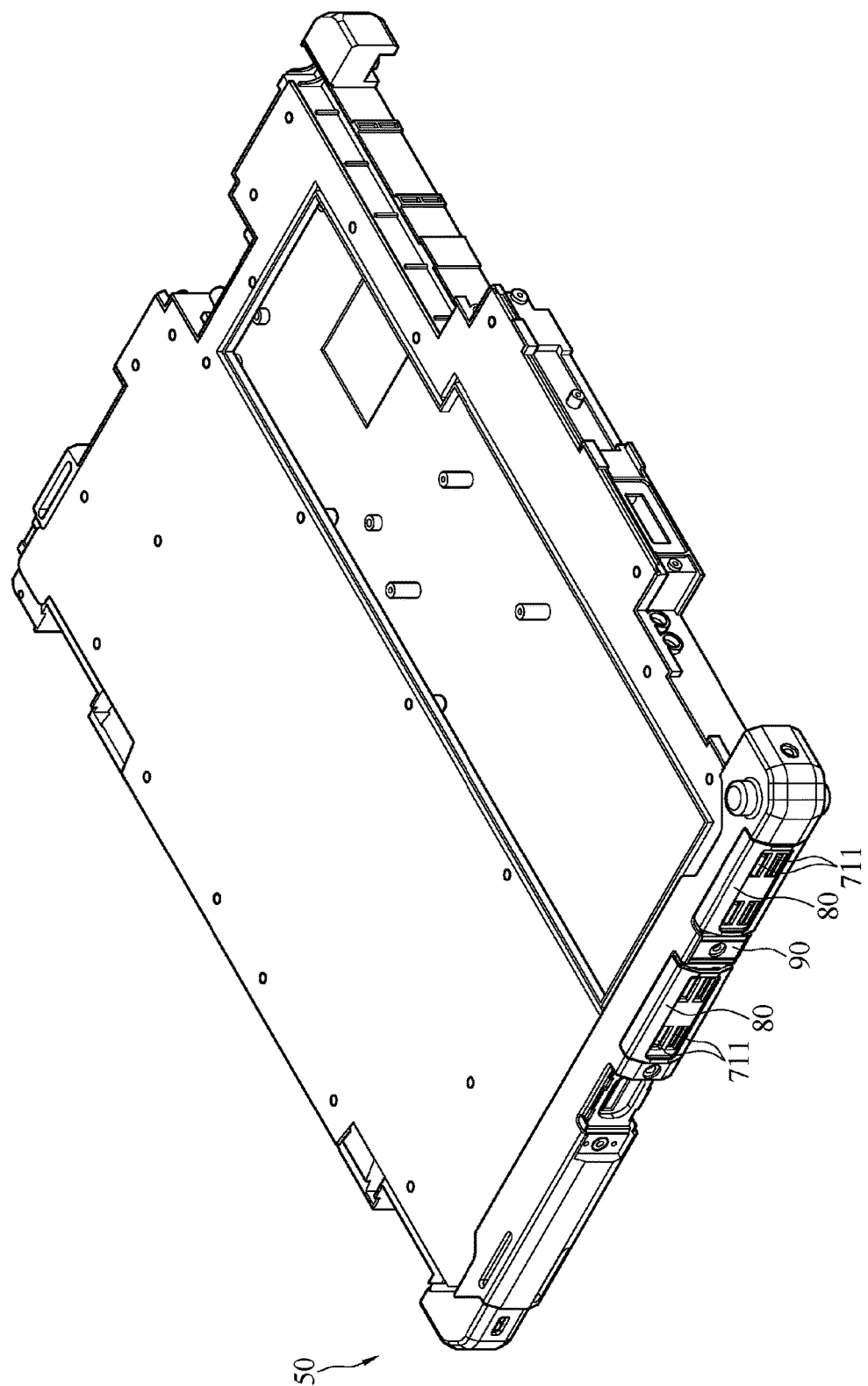
FIG. 5 is a schematic view of the device with a waterproof structure that shuts the lid according to a second embodiment of the present invention.
Figure 6:
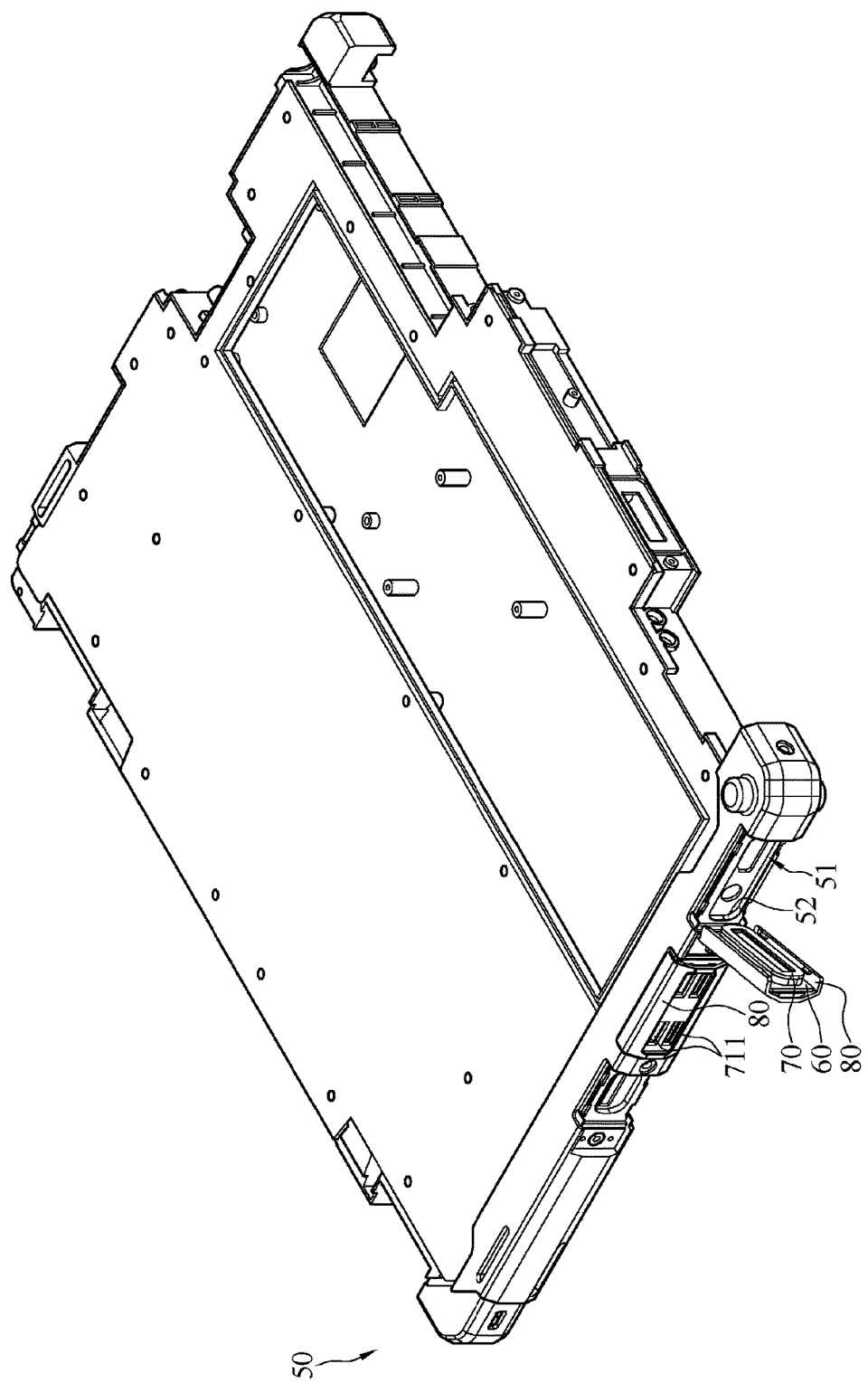
FIG. 6 is a schematic view of the device with a waterproof structure that opens the lid according to the second embodiment of the present invention.
Figure 7:
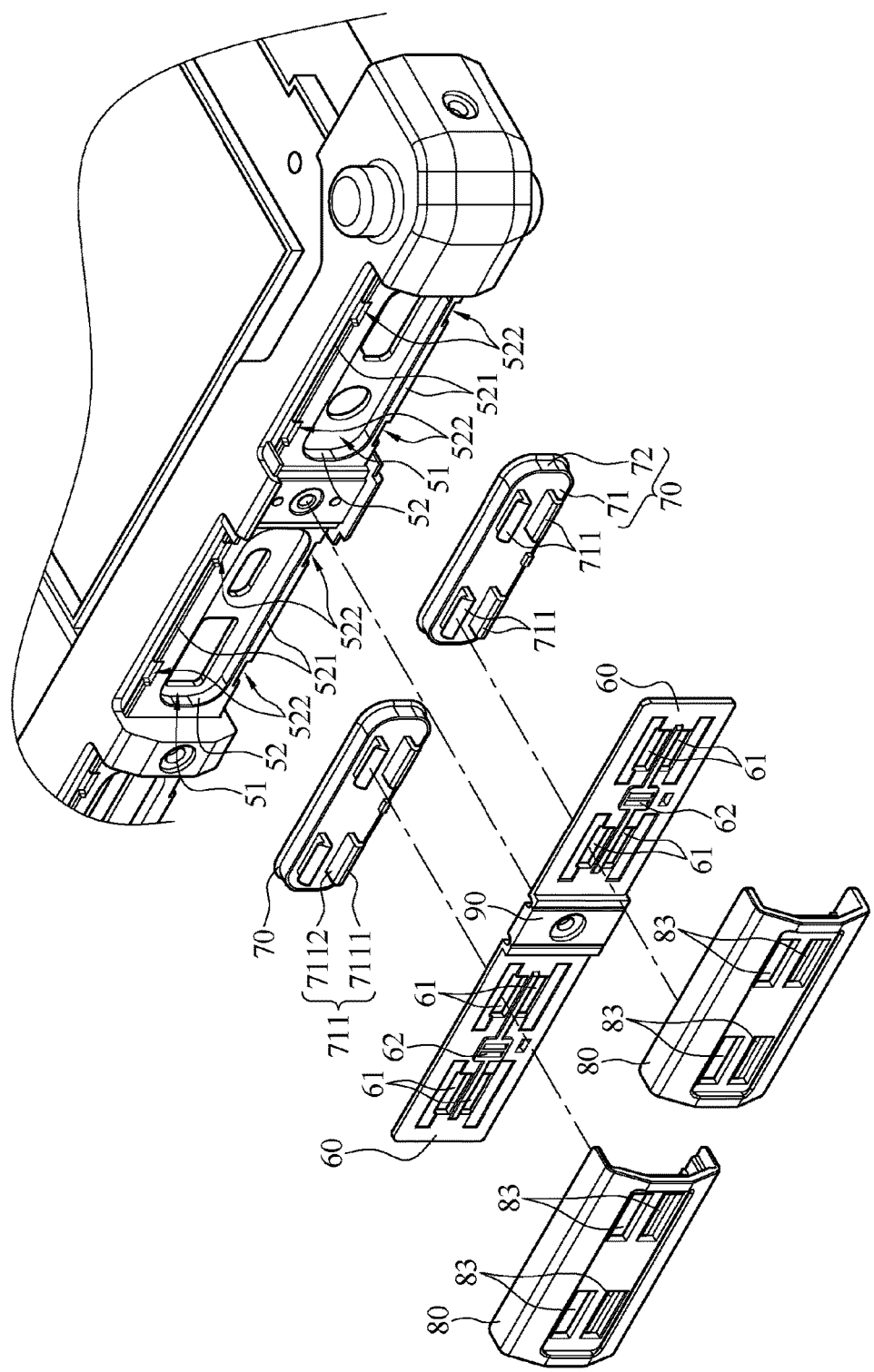
FIG. 7 is an exploded view of the waterproof structure according to the second embodiment of the present invention.
Figure 8:
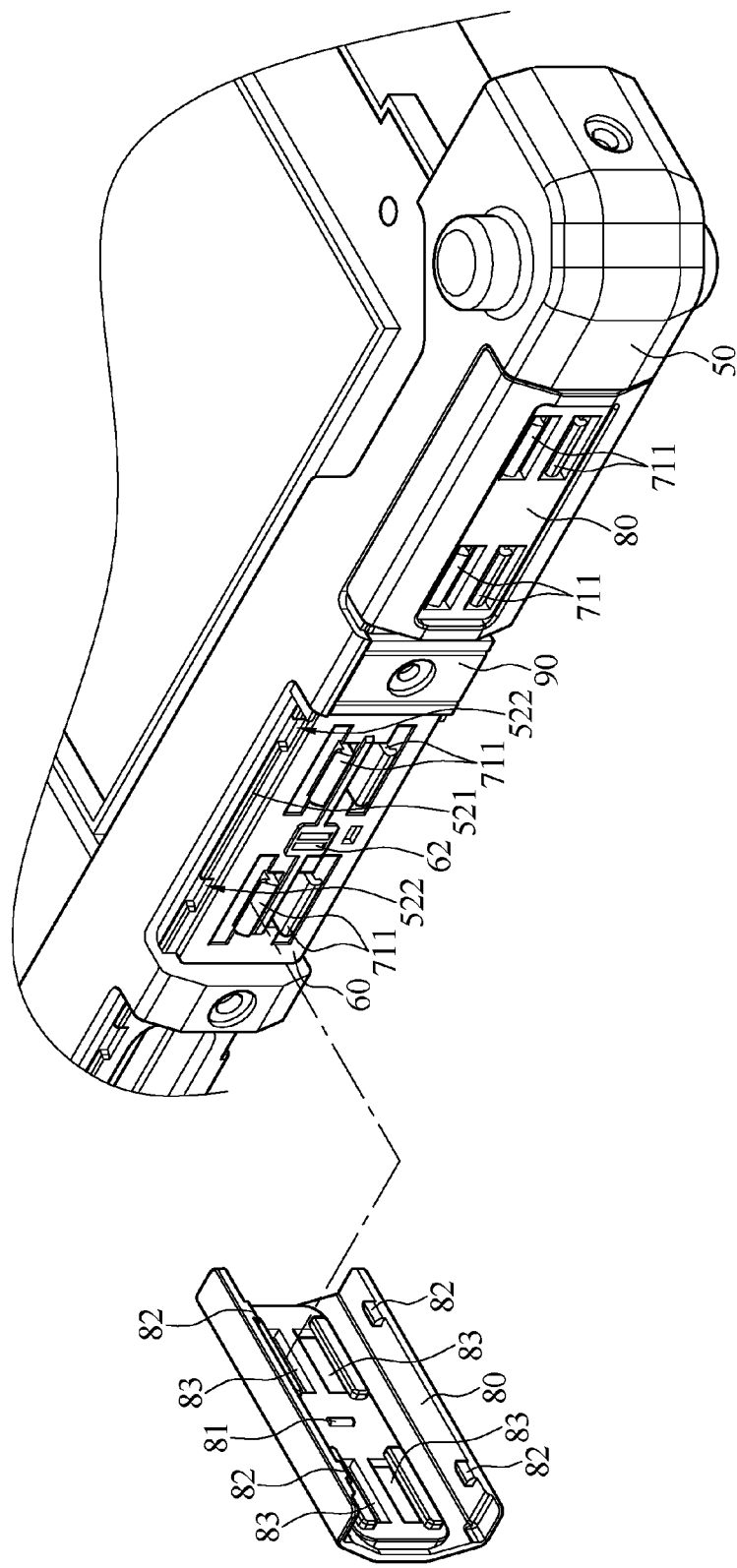
FIG. 8 is an exploded view of the waterproof structure which a door is separated from according to the second embodiment of the present invention.

FIG. 5 is a schematic view of the device with a waterproof structure that shuts the lid according to a second embodiment of the present invention. FIG. 6 is a schematic view of the device with a waterproof structure that opens the lid according to the second embodiment of the present invention. FIG. 7 is an exploded view of the waterproof structure according to the second embodiment of the present invention. FIG. 8 is an exploded view of the waterproof structure which a door is separated from according to the second embodiment of the present invention.

Components of the second embodiment are substantially identical to components of the first embodiment but are applicable to openings with various sizes and positions; hence, the second embodiment differs slightly from the first embodiment in terms of shape and structure. Referring to FIG. 5 through FIG. 8, in the second embodiment, the device with a waterproof structure comprises a casing 50, two lids 60, two securing elements 70 and two doors 80.

In the second embodiment, which relates to a device with plenty of ways of connecting openings, the casing 50 is penetrated by two openings 51 arranged side by side. The openings 51 are each surrounded by a waterproof wall 52. The openings 51 each hold a port of a connector or enable another component to be mounted in place.

The lids 60 are fastened to the casing 50 to selectively cover or move away from the openings 51. FIG. 5 shows that the lids 60 cover the openings 51. FIG. 6 shows that the lid 60 on the right moves away the openings 51, that is, opened. In the second embodiment, since there are two openings, on the left and on the right, there must be two lids 60 (one on the left, the other one on the right) for covering the openings, respectively. Hence, the lids 60 are connected by a connecting element 90. The connecting element 90 is fastened to the casing 50 to therefore fix the two lids 60 in place. The securing elements 70 and the doors 80 are mounted on the lids 60, respectively, and move together with the lids 60. The lids 60 are fixed to the casing 50 by adhesion, a means of securing, and the like, but the present invention is not limited thereto.

Referring to FIG. 7 and FIG. 8, the securing elements 70 each comprise a snap engaging portion 71 and a waterproof plate 72. The waterproof plate 72 encloses the snap engaging portion 71 and covers a lateral surface thereof. Referring to FIG. 7, the waterproof plate 72 covers a surface of the snap engaging portion 71 and encloses the snap engaging portion 71, wherein the covered surface faces the opening 51. To engage with the waterproof wall 52 more tightly, the waterproof plate 72 protrudes outward more than the snap engaging portion 71. A manufacturing process of the securing elements 70 involves manufacturing the snap engaging portion 71 and the waterproof plate 72 separately and then adhering them together. Alternatively, the snap engaging portion 71 and the waterproof plate 72 are integrally formed by double injection. The waterproof plate 72 is made of a resilient material, whereas the snap engaging portion 71 is made of a rigid material.

Due to the snap engaging portion 71, the securing elements 70 are demountably mounted on the lids 60. In the second embodiment, the lids 60 each comprise four fastening holes 61. The snap engaging portions 71 each comprise four engaging hooks 711. The engaging hooks 711 penetrate the fastening holes 61, respectively, so that the securing elements 70 can be fastened to the lids 60. When the lids 60 cover the openings 51, the securing elements 70 mounted on the lids 60 move together with the lids 60 so that the waterproof plate 72 covers the openings 51. After the waterproof plate 72 has covered the openings 51, the rim of the waterproof plate 72 is in tight contact with the waterproof wall 52, providing a waterproofing effect.

In the second embodiment, the engaging hooks 711 each comprise a hook portion 7111 and a shank 7112. The fastening holes 61 are slightly larger than the shanks 7112 of the engaging hooks 711. After the engaging hooks 711 of the snap engaging portion 71 have penetrated the fastening holes 61, the hook portions 7111 hook onto the doors 80, whereas the shanks 7112 are penetratingly disposed in the fastening holes 61. With the fastening holes 61 being slightly larger than the shanks 7112, the shanks 7112 can move radially inside the fastening holes 61 slightly. Hence, after the securing elements 70 have been mounted on the lids 60, the securing elements 70 can move relative to the lids 60 slightly in a direction parallel thereto. With the securing elements 70 being capable of moving relative to the lids 60 slightly, the waterproof plates 72 of the securing elements 70 cover the openings 51 and come into tight 360°-rotatable contact with the waterproof wall 52, allowing the waterproof plate 72 to align with the waterproof wall 52 accurately, not to mention that the rim of the waterproof plate 72 can be in tightest contact with the waterproof wall 52. Hence, no process of mounting the lids 60 in place or mounting the securing elements 70 on the lids 60 leads to a tolerance which might otherwise affect the degree of tight contact between the waterproof plate 72 and the waterproof wall 52.

The doors 80 cover the lids 60 from the outside and are fastened to the casing 50 to prevent the lids 60 in operation from falling off when hit. The second embodiment differs from the first embodiment in the door structure. In the first embodiment, as shown in the diagrams, the door 40 is slided vertically in order to shut or open. In the second embodiment, as shown in the diagrams, the doors 80 are slided horizontally in order to shut or open. The doors 80 and related connection structures are described in detail below.

In the second embodiment, the doors 80 are disposed on the lids 60 and face away from the securing elements 70, whereas the engaging hooks 711 of the snap engaging portions 71 of the securing elements 70 penetrate the lids 60, penetrate the doors 80, and hook onto the doors 80, as shown in FIG. 8. The doors 80 each have through holes 83, whereas the shanks 7112 of the engaging hooks 711 are penetratingly disposed in the through holes 83, respectively, and the horizontal length of the through holes 83 is slightly larger than that of the shanks 7112, providing sufficient room for horizontal movement of the doors 80. The engaging hooks 711 enable the doors 80 to slide horizontally relative to the lids 60 but still connect with the lids 60 and thus cannot escape.

The doors 80 each comprise a bulge 81. The lids 60 each comprise a positioning recess 62. The bulge 81 is received in the positioning recess 62. The bulge 81 is slidable between two recess portions in the positioning recess 62, providing a sense of snap-engagement to the user. The description below is illustrated by the door 80 on the right. To open the doors 80, the user moves the doors 80 leftward so that the bulge 81 moves from the recess portion on the right of the positioning recess 62 to the recess portion on the left of the positioning recess 62, and falls into the recess portion again as soon as it passes an elevation in the midst of the course of its movement, providing a sense of snap-engagement to the user. At this point in time, the sense of snap-engagement lets the user know that s/he has opened the doors 80 and therefore must stop pushing the doors 80. The engaging hooks 711 engaged with the doors 80 also prevent the doors 80 from being pushed excessively.

Referring to FIG. 7 and FIG. 8, the waterproof wall 52 extends to form two fastening walls 521. The two fastening walls 521 are parallel, with one above the other. The fastening walls 521 each have two through recesses 522. The doors 80 each have four inner hooks 82. The inner hooks 82 penetrate the through recess 522, respectively, and slide along the fastening walls 521. When the lids 60 cover the openings 51, the user may slide the door 80 (on the left) leftward or the door 80 (on the right) rightward so that the inner hooks 82 hook onto the fastening walls 521, respectively, fastening the doors 80 to the casing 50; hence, the lids 60 never opens just because it is hit, and the appearance of the device provides a sense of completeness. Fastening the doors 80 to the casing 50 in the aforesaid manner not only prevents the lids 60 from opening just because it is hit, but also allows the lids 60 to open quickly—the user slides the doors 80 leftward to unfasten it, thereby opening the lids 60.

To cover the openings 51 and effectuate waterproofing, the user only needs to cover the openings 51 with the lids 60 so that the waterproof plates 72 of the securing elements 70 come into tight contact with the waterproof wall 52. Afterward, the user slides the doors 80 leftward or rightward to fasten it to the casing 50, preventing the lids 60 from being hit and thus opened. An O-ring is replaced with the waterproof plate 72 which is in tight contact with the waterproof walls 52 at the openings 51 on the casing 50, effectuating waterproofing. Due to the snap engaging portion 71, the waterproof plate 72 is demountably mounted on the lids 60 to not only preclude errors which might otherwise arise from an assembly process but also allow the securing elements 70 to be quickly replaceable in response to wear and tear arising from long use of the waterproof plate 72.

Although the present invention is disclosed above by preferred embodiments, the preferred embodiments are not restrictive of the present invention. Any persons skilled in the art can make some changes and modifications to the preferred embodiments without departing from the spirit and scope of the present invention. Accordingly, the legal protection for the present invention should be defined by the appended claims.

What is claimed is:

1. A device with a waterproof structure, comprising:
   a casing penetrated by an opening, the opening being surrounded by a waterproof wall;
   a lid fastened to the casing to selectively cover or move away from the opening;
   a securing element comprising a snap engaging portion and a waterproof plate, the waterproof plate enclosing the snap engaging portion and covering a lateral surface thereof, wherein, due to the snap engaging portion, the securing element is demountably mounted on the lid, and a rim of the waterproof plate is in tight contact with the waterproof wall after the lid has covered the opening;
   a door slidably disposed on the lid;
   wherein the door comprises a bulge and two through holes, and the lid comprises a positioning recess and two positioning elements, the bulge being received in the positioning recess, and the positioning elements being penetratingly disposed in the through holes, respectively.

2. The device with the waterproof structure in accordance with claim 1, wherein the snap engaging portion and the waterproof plate are integrally formed by double injection.

3. The device with the waterproof structure in accordance with claim 1, wherein the lid comprises at least two fastening holes, and the snap engaging portion comprises at least two engaging hooks penetrating the fastening holes, respectively.

4. The device with the waterproof structure in accordance with claim 3, wherein the engaging hooks each comprise a hook portion and a shank, and the fastening holes are slightly larger than the shanks of the engaging hooks so that the waterproof plate is in tight 360°-rotatable contact with the waterproof wall.

5. The device with the waterproof structure in accordance with claim 1, wherein the waterproof wall extends to form two fastening walls, and two inner hooks are disposed at two ends of the door, respectively, allowing the inner hooks to hook onto the fastening walls, respectively.

6. A device with a waterproof structure, comprising:
   a casing penetrated by an opening, the opening being surrounded by a waterproof wall;
   a lid fastened to the casing to selectively cover or move away from the opening;
   a securing element comprising a snap engaging portion and a waterproof plate, the waterproof plate enclosing the snap engaging portion and covering a lateral surface thereof, wherein, due to the snap engaging portion, the securing element is demountably mounted on the lid, and a rim of the waterproof plate is in tight contact with the waterproof wall after the lid has covered the opening;
   a door slidably disposed on the lid;
   wherein the door is disposed on the lid and faces away from the securing element, and the snap engaging portion of the securing element comprises a plurality of engaging hooks penetrating the lid and snap-engaged with the door.

7. The device with the waterproof structure in accordance with claim 6, wherein the door comprises a bulge, and the lid comprises a positioning recess, the bulge being received in the positioning recess.

8. The device with the waterproof structure in accordance with claim 6, wherein the waterproof wall extends to form two fastening walls each having at least one through recess, and the door has at least two inner hooks penetrating the through recesses, respectively, to slide along the fastening walls.

9. A device with a waterproof structure, comprising:
a casing having an opening with a wall;
a lid fastened to the casing, wherein the lid comprises a fastening hole;
an engaging portion comprising a shank, wherein the shank is received in the fastening hole so as to mount the engaging portion on the lid, and wherein the fastening hole is larger than the shank such that the shank can move radially inside the fastening hole when the engaging portion is mounted on the lid; and
a seal member formed on the engaging portion;
wherein, when the lid is moved to cover the opening, the seal member together with the engaging portion is aligned by the wall due to radial motion of the shank such that a waterproof fit is achieved between the wall and seal member.

10. The device with the waterproof structure in accordance with claim 9, wherein the engaging portion further comprises a hook portion for snap-engaging with the lid.

11. The device with the waterproof structure in accordance with claim 9, further comprising a door slidably disposed on the lid.

12. The device with the waterproof structure in accordance with claim 11, wherein the wall extends to form two fastening walls, and two inner hooks are disposed at two ends of the door, respectively, allowing the inner hooks to hook onto the fastening walls, respectively.

13. The device with the waterproof structure in accordance with claim 11, wherein the door comprises a bulge and two through holes, and the lid comprises a positioning recess and two positioning elements, the bulge being received in the positioning recess, and the positioning elements being penetratingly disposed in the through holes, respectively.

14. The device with the waterproof structure in accordance with claim 11, wherein the door is disposed on the lid and faces away from the engaging portion, and the shank is snap-engaged with the door.

15. The device with the waterproof structure in accordance with claim 14, wherein the door comprises a bulge, and the lid comprises a positioning recess, the bulge being received in the positioning recess.

16. The device with the waterproof structure in accordance with claim 14, wherein the wall extends to form two fastening walls each having at least one through recess, and the door has at least two inner hooks penetrating the through recesses, respectively, to slide along the fastening walls.

17. The device with the waterproof structure in accordance with claim 9, wherein the engaging portion and the seal member are integrally formed by double injection.

18. The device with the waterproof structure in accordance with claim 9, wherein the engaging portion is removably mounted on the lid.

* * * * *